(12) United States Patent
Chen et al.

(10) Patent No.: US 12,308,842 B2
(45) Date of Patent: May 20, 2025

(54) FREQUENCY CALIBRATION CIRCUIT AND METHOD FOR CALIBRATING OSCILLATION FREQUENCY OF CONTROLLABLE OSCILLATOR

(71) Applicant: MEDIATEK INC., Hsin-Chu (TW)

(72) Inventors: Chien-Wei Chen, Hsinchu (TW); Kairen Fong, Hsinchu (TW); Chao-Ching Hung, Hsinchu (TW); Yu-Li Hsueh, Hsinchu (TW)

(73) Assignee: MEDIATEK INC., Hsinchu (TW)

( * ) Notice: Subject to any disclaimer, the term of this patent is extended or adjusted under 35 U.S.C. 154(b) by 12 days.

(21) Appl. No.: 18/223,537

(22) Filed: Jul. 18, 2023

(65) Prior Publication Data

US 2024/0171161 A1 May 23, 2024

Related U.S. Application Data

(60) Provisional application No. 63/426,052, filed on Nov. 17, 2022.

(51) Int. Cl.
*H03K 5/01* (2006.01)
*G04F 10/00* (2006.01)
*H03K 3/037* (2006.01)

(52) U.S. Cl.
CPC ............. *H03K 5/01* (2013.01); *G04F 10/005* (2013.01); *H03K 3/037* (2013.01)

(58) Field of Classification Search
CPC ......... H03K 5/01; H03K 3/037; G04F 10/005
USPC ...................... 331/1 A, 25, 34; 327/156, 159
See application file for complete search history.

(56) References Cited

U.S. PATENT DOCUMENTS

| | | | |
|---|---|---|---|
| 8,193,963 B2* | 6/2012 | Wang .................... | G04F 10/005 331/25 |
| 11,646,743 B1* | 5/2023 | Sabharwal ............. | H03L 7/095 327/156 |
| 2023/0170915 A1* | 6/2023 | Sjoland ............... | H03M 1/1028 341/120 |

* cited by examiner

*Primary Examiner* — Arnold M Kinkead
(74) *Attorney, Agent, or Firm* — Winston Hsu

(57) ABSTRACT

A frequency calibration (FCAL) circuit and a method for calibrating an oscillation frequency of a controllable oscillator are provided. The FCAL circuit includes the controllable oscillator, a divider, a time-to-digital converter (TDC) and a calibration logic. The controllable oscillator generates a controllable oscillation clock according to a calibration code. The divider divides the oscillation frequency of the controllable oscillation clock by a predetermined divisor to generate a divided clock. The TDC converts a first period between first edges of a reference clock and the divided clock into a first period code and converts a second period between second edges of the reference clock and the divided clock into a second period code. The calibration logic compares the first period code and the second period code to generate a comparison result for determining whether the first period is greater or less than the second period, and accordingly controls the calibration code.

19 Claims, 6 Drawing Sheets

FREQUENCY CALIBRATION CIRCUIT AND METHOD FOR CALIBRATING OSCILLATION FREQUENCY OF CONTROLLABLE OSCILLATOR

CROSS REFERENCE TO RELATED APPLICATIONS

This application claims the benefit of U.S. Provisional Application No. 63/426,052, filed on Nov. 17, 2022. The content of the application is incorporated herein by reference.

BACKGROUND

The present invention is related to frequency calibration (FCAL), and more particularly, to an FCAL circuit and a method for calibrating an oscillation frequency of a controllable oscillator.

In Bluetooth Low Energy (BLE) applications, a frequency synthesizer (which may include a crystal oscillator and a phase locked loop) is periodically switched among a sleep mode, an idle mode and a receiving (RX) mode, and may enter a transmitting (TX) mode if needed (e.g. when a request of transmitting a packet is received). In the idle mode (which may be regarded as a transition phase from the sleep mode to the RX mode or a transition phase from the RX mode to the TX mode), the frequency synthesizer may perform FCAL and a phase locking operation for settling an output of the frequency synthesizer to a target frequency. In addition to the FCAL and the phase locking operation, operations of the idle mode may further include some setup tasks related to digital circuits. As a total time period of the idle mode is typically limited, if a time period of the FCAL is too long to allow the digital circuits to complete the setup tasks with a regular clock rate, an additional clock source with a clock rate greater than the regular clock rate will be required to make the digital circuits operate in a higher speed, and digital power consumption is therefore increased.

In another scenario, the frequency synthesizer may serve for different channels, and the FCAL and the phase locking operation mentioned above may be performed during the switching between the different channels, where the speed for completing the FCAL under this scenario is too strict to be achieved by an FCAL technique of a related art.

Thus, there is a need for a novel architecture of a FCAL circuit and an associated method, which can reduce a total time period of the FCAL without introducing any side effect or in a way that is less likely to introduce side effects.

SUMMARY

An objective of the present invention is to provide a frequency calibration (FCAL) circuit and a method for calibrating an oscillation frequency of a controllable oscillator, which can improve an accuracy of an FCAL operation under a predetermined time budget in comparison with the related art.

Another objective of the present invention is to provide an FCAL circuit and a method for calibrating an oscillation frequency of a controllable oscillator, which can reduce the total time period for calibrating the oscillation frequency to reach a predetermined accuracy without greatly increase additional costs.

At least one embodiment of the present invention provides an FCAL circuit. The FCAL circuit comprises a controllable oscillator, a divider, a time-to-digital converter (TDC) and a calibration logic, wherein the divider is coupled to the controllable oscillator, the TDC is coupled to the divider, and the calibration logic is coupled to the controllable oscillator and the TDC. The controllable oscillator is configured to generate a controllable oscillation clock according to a calibration code, wherein an oscillation frequency of the controllable oscillation clock is controlled according to the calibration code. The divider is configured to divide the oscillation frequency of the controllable oscillation clock by a predetermined divisor to generate a divided clock. The TDC is configured to convert a first period between a first edge of a reference clock and a first edge of the divided clock into a first period code and convert a second period between a second edge of the reference clock and a second edge of the divided clock into a second period code. The calibration logic is configured to compare the first period code and the second period code to generate a comparison result for determining whether the first period is greater or less than the second period, and control the calibration code according to the comparison result.

At least one embodiment of the present invention provides a method for calibrating an oscillation frequency of a controllable oscillator. The method comprises: utilizing the controllable oscillator to generate a controllable oscillation clock according to a calibration code, wherein the oscillation frequency of the controllable oscillation clock is controlled according to the calibration code; utilizing a divider to divide the oscillation frequency of the controllable oscillation clock by a predetermined divisor to generate a divided clock; utilizing a TDC to convert a first period between a first edge of a reference clock and a first edge of the divided clock into a first period code and convert a second period between a second edge of the reference clock and a second edge of the divided clock into a second period code; and utilizing a calibration logic to compare the first period code and the second period code to generate a comparison result for determining whether the first period is greater or less than the second period, and control the calibration code according to the comparison result.

The FCAL circuit and the method provided by the embodiments of the present invention substantially obtain information of a fractional part of a detected number of cycles within a gating window specified by the reference clock. In comparison with detecting the integer part of the detected number of cycles within the gating window, the present invention can greatly improve the resolution of FCAL, and thereby greatly reduce the time for calibrating the oscillation frequency.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
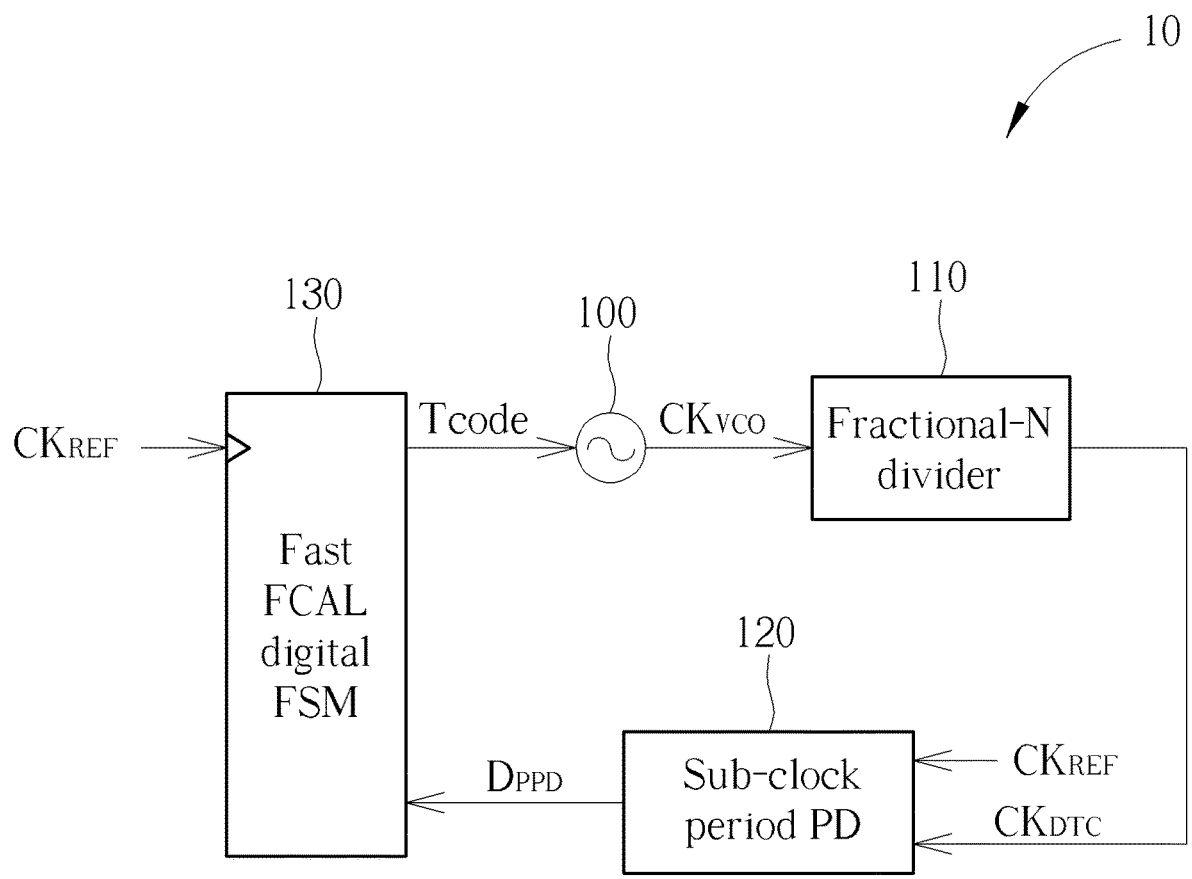
FIG. 1 is a diagram illustrating a frequency calibration circuit according to an embodiment of the present invention.

FIG. 1 is a diagram illustrating a frequency calibration (FCAL) circuit 10 according to an embodiment of the present invention. As shown in FIG. 1, the FCAL circuit 10 may comprise a controllable oscillator such as a voltage controlled oscillator (VCO) 100, a divider such as a fractional-N divider 110, a time-to-digital converter (TDC) such as a sub-clock period phase detector (PD) 120, and a calibration logic such as a fast FCAL digital finite state machine (FSM) 130, where the fractional-N divider 110 is coupled to the VCO 100, the sub-clock period PD 120 is coupled to the fractional-N divider 110, and the fast FCAL digital FSM 130 is coupled to the VCO 100 and the sub-clock period PD 120. In this embodiment, the VCO 100 is configured to generate a controllable oscillation clock such as a VCO clock $CK_{VCO}$ according to a calibration code Tcode, wherein an oscillation frequency of the VCO clock $CK_{VCO}$ is controlled according to the calibration code Tcode. The fractional-N divider 110 is configured to divide the oscillation frequency of the VCO clock $CK_{VCO}$ by a predetermined divisor to generate a divided clock $CK_{DTC}$. The sub-clock period PD 120 is configured to convert a first period between a first edge of a reference clock $CK_{REF}$ (which may be received from a crystal oscillator) and a first edge of the divided clock $CK_{DTC}$ into a first period code and convert a second period between a second edge of the reference clock $CK_{REF}$ and a second edge of the divided clock $CK_{DTC}$ into a second period code. For example, the sub-clock period PD 120 may generate a period code $D_{PPD}$ according to the reference clock $CK_{REF}$ and the divided clock $CK_{DTC}$, where the period code $D_{PPD}$ output at a first time point (e.g. at which the sub-clock period PD 120 performs a time-to-digital conversion upon the first period) may represent the first period code, and the period code $D_{PPD}$ output at a second time point (e.g. at which the sub-clock period PD 120 performs the time-to-digital conversion upon the second period) may represent the second period code. The fast FCAL digital FSM 130 is configured to compare the first period code and the second period code to generate a comparison result for determining whether the first period is greater or less than the second period, and control the calibration code Tcode according to the comparison result.

In this embodiment, the predetermined divisor is set according to a ratio of a target of the oscillation frequency of the VCO clock $CK_{VCO}$ and a reference frequency of the reference clock $CK_{REF}$. For example, the predetermined divisor may be set as a calculation result of dividing the target of the oscillation frequency of the VCO clock $CK_{VCO}$ by the reference frequency of the reference clock $CK_{REF}$. More particularly, the divider may be a divided-by-N divider such as the fractional-N divider 110, where N may represent the predetermined divisor which is a non-integer divisor. It should be noted that the divider implemented with the fractional-N divider 110 is for illustrative purposes only, and is not meant to be a limitation of the present invention. In some embodiment, the divider may be implemented to have an integer divisor (e.g. the predetermined divisor is set to be an integer) if the target of the oscillation frequency of the VCO clock $CK_{VCO}$ is integer times the reference frequency of the reference clock $CK_{REF}$.

Figure 2:
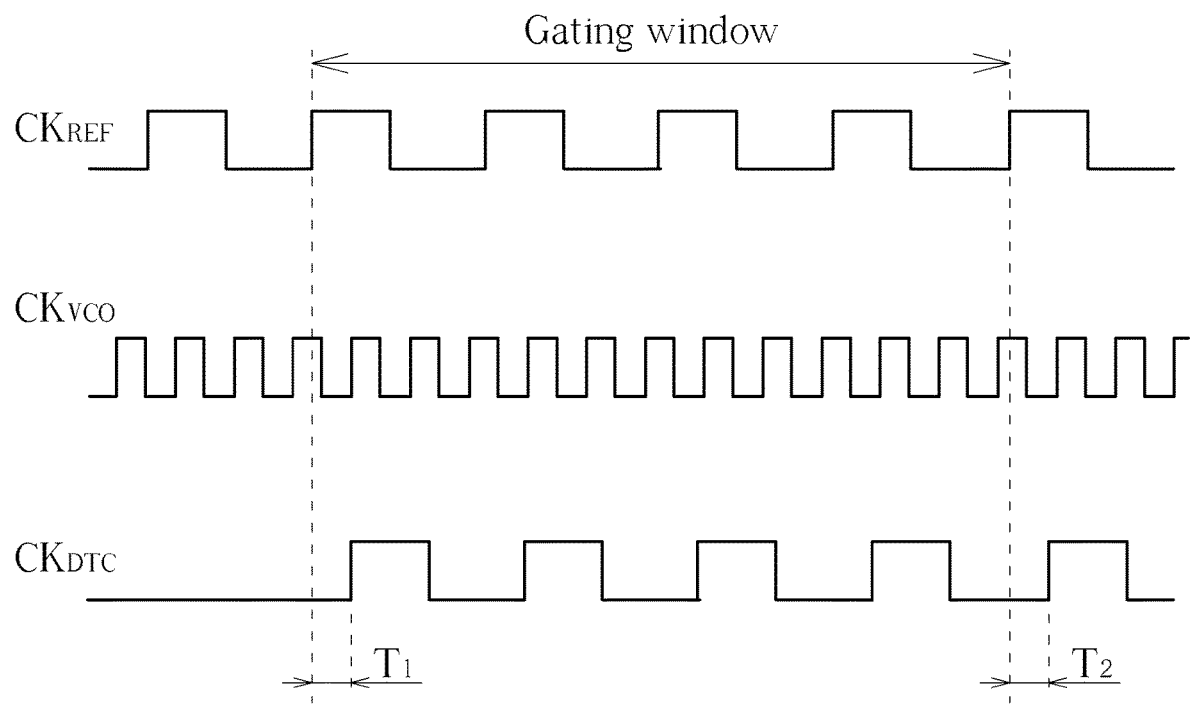
FIG. 2 is a diagram illustrating some signals shown in FIG. 1 according to an embodiment of the present invention.

FIG. 2 is a diagram illustrating some signals such as the reference clock $CK_{REF}$, the VCO clock $CK_{REF}$ and the divided clock $CK_{DTC}$ shown in FIG. 1 according to an embodiment of the present invention. As the reference frequency of the reference clock $CK_{REF}$ is known and constant, a gating window specified with a certain number of cycles of the reference clock $CK_{REF}$ may be taken as a reference time period, and a number of cycles of the VCO clock $CK_{VCO}$ within the reference time period can be counted in order to determine whether the VCO clock $CK_{VCO}$ is too fast or too slow. A typical counter circuit is limited to obtain an integer portion of the number of cycles of the VCO clock $CK_{VCO}$ within the reference time period only, however. If the detection of the number of cycles of the VCO clock $CK_{VCO}$ within the reference time period is performed by the typical counter circuit only, a width of the gating window (i.e. a length of the reference time period) may need to be increased in order to achieve sufficient resolution of FCAL, and a total time for completing the FCAL of the oscillation frequency may be greatly increase.

In this embodiment, a starting time point (which is indicated by a first dashed line shown in FIG. 2) of the gating window is specified by the first edge of the reference clock $CK_{REF}$ (e.g. a second rising edge of the reference clock $CK_{REF}$ shown in FIG. 2), and an ending time point (which is indicated by a second dashed line shown in FIG. 2) of the gating window is specified by the second edge of the reference clock $CK_{REF}$ (e.g. a sixth rising edge of the reference clock $CK_{REF}$ shown in FIG. 2), where the first edge of the divided clock $CK_{DTC}$ and the second edge of the divided clock are edges (e.g. rising edges) respectively following the first edge of the reference clock $CK_{REF}$ and the second edge of the reference clock $CK_{REF}$. For example, the first edge of the divided clock $CK_{DTC}$ may be a first rising edge after the starting time point of the gating window, and the second edge of the divided clock $CK_{DTC}$ may be a first rising edge after the ending time point of the gating window. Thus, a period $T_1$ shown in FIG. 2 may be an example of the first period, and a period $T_2$ shown in FIG. 2 may be an example of the second period.

As the predetermined divisor is set according to the ratio of the target of the oscillation frequency of the VCO clock $CK_{VCO}$ and the reference frequency of the reference clock $CK_{REF}$, a divided frequency of the divided clock $CK_{DTC}$ is expected to be identical to the reference frequency of the reference clock $CK_{REF}$ when the oscillation frequency of the VCO clock $CK_{VCO}$ meets the target, and a time period between the first edge of the divided clock $CK_{DTC}$ and the second edge of the divided clock $CK_{DTC}$ is expected to be identical to a time period between the first edge of the reference clock $CK_{REF}$ and the second edge of the reference clock $CK_{REF}$. In particular, when the oscillation frequency of the VCO clock $CK_{VCO}$ meets the target, the When the oscillation frequency of the VCO clock $CK_{VCO}$ is greater than the target (i.e. the VCO clock $CK_{VCO}$ is too fast), the period $T_2$ may be less the period $T_1$. When the oscillation frequency of the VCO clock $CK_{VCO}$ is less than the target (i.e. the VCO clock $CK_{VCO}$ is too slow), the period $T_2$ may be greater the period $T_1$. Thus, the fast FCAL digital FSM 130 is configured to control the calibration code Tcode to make the second period code approach the first period code during the FCAL. For example, when the comparison result indicates that the period $T_2$ is less than the period $T_1$, the fast FCAL digital FSM 130 may switch the calibration code Tcode to reduce the oscillation frequency of the VCO clock $CK_{VCO}$. When the comparison result indicates that the period $T_2$ is greater than the period $T_1$, the fast FCAL digital FSM 130 may switch the calibration code Tcode to increase the oscillation frequency of the VCO clock $CK_{VCO}$.

Figure 3:
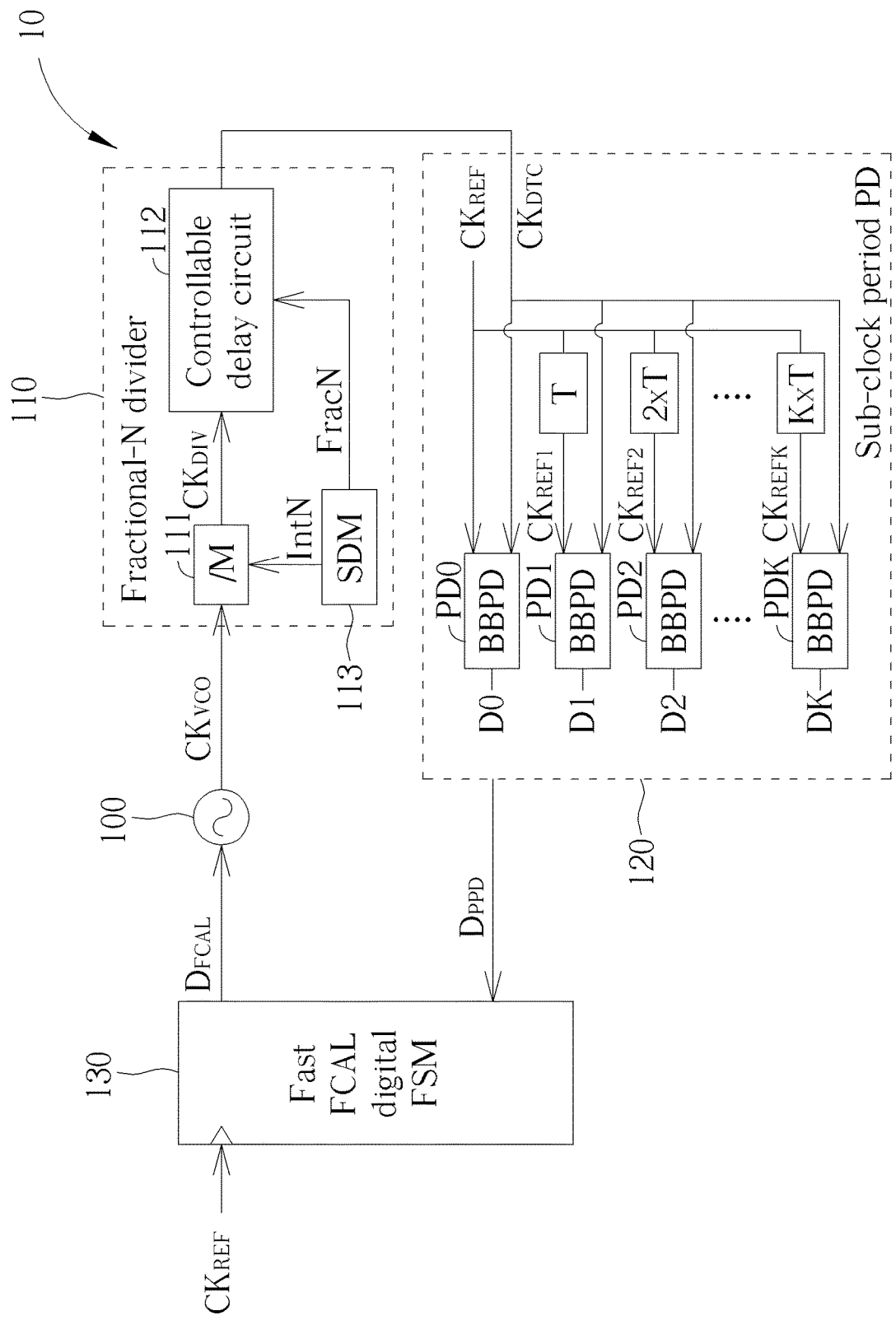
FIG. 3 is a diagram illustrating detailed implementation of the frequency calibration circuit shown in FIG. 1 according to an embodiment of the present invention.

FIG. 3 is a diagram illustrating detailed implementation of the FCAL circuit 10 shown in FIG. 1 according to an embodiment of the present invention. As shown in FIG. 3, the fractional-N divider 110 may comprise a divided-by-M divider 111 (labeled "/M" in FIG. 3 for brevity), a controllable delay circuit 112 and a sigma-delta modulator (SDM) 113, where the divided-by-M divider 111 is coupled to the VCO 100, the controllable delay circuit 112 is coupled to the divided-by-M divider 111, and the SDM 113 is coupled to the divided-by-M divider 111 and the controllable delay circuit 112. In this embodiment, the divided-by-M divider 111 is configured to divide the oscillation frequency of the VCO clock $CK_{VCO}$ by an integer divisor to generate a divided-by-integer clock $CK_{DIV}$, wherein M represents the integer divisor. The controllable delay circuit 112 may be a digital-to-time converter (DTC) or a voltage controlled delay line (VCDL), where the controllable delay circuit 112 is configured to apply a controllable delay to the divided-by-integer clock $CK_{DIV}$ for generating the divided clock $CK_{DTC}$. More particularly, the integer divisor is controlled according to an integer portion of the predetermined divisor (e.g. an integer portion of N), and the controllable delay is controlled according to a fractional portion of the predetermined divisor (e.g. a fractional portion of N). In this embodiment, the SDM 113 is configured to generate an integer control signal IntN according to the integer portion of the predetermined divisor for controlling the integer divisor (i.e. M) and generate a fractional control signal FracN according to the fractional portion of the predetermined divisor for controlling the controllable delay. By applying the controllable delay to the divided-by-integer clock $CK_{DIV}$, the divided clock $CK_{DTC}$ output from the controllable delay circuit 112 may be equivalent to a divided-by-N result of the VCO clock $CK_{VCO}$.

In addition, the sub-clock period PD 120 may comprise multiple delay elements and multiple phase detectors such as K bang-bang phase detectors (BBPDs) PD0, PD1, PD2, . . . and PDK, where K may be an integer. The multiple delay elements is configured to generate multiple delayed reference clocks such as $CK_{REF1}$, $CK_{REF2}$, . . . and $CK_{REFK}$ by applying different delays such as T, (2×T), . . . and (K×T) to the reference clock $CK_{REF}$, where T may represent a unit delay. For example, the delayed reference clock $CK_{REF1}$ may have the delay of T relative to the reference clock $CK_{REF}$, the delayed reference clock $CK_{REF2}$ may have the delay of (2×T) relative to the reference clock $CK_{REF}$, and the rest may be deduced by analogy, where the delayed reference clock $CK_{REFK}$ may have the delay of (K×T) relative to the reference clock $CK_{REF}$.

When generating the first period code, the BBPD PD0 is configured to detect whether the first edge of the divided clock $CK_{DTC}$ leads or lags with respect to a first reference edge of the reference clock $CK_{REF}$ (e.g. the first edge of the reference clock $CK_{REF}$ mentioned above) for generating a first bit of the first period code such as an output D0 of the BBPD PD0 at the first time point (e.g. at which the sub-clock period PD 120 performs the time-to-digital conversion upon the first period). The BBPD PD1 is configured to detect whether the first edge of the divided clock $CK_{DTC}$ leads or lags with respect to a first reference edge of the reference clock $CK_{REF1}$ (e.g. a delayed-by-T edge of the first edge of the reference clock $CK_{REF}$) for generating a second bit of multiple bits of the first period code such as an output D1 of the BBPD PD1 at the first time point. The BBPD PD2 is configured to detect whether the first edge of the divided clock $CK_{DTC}$ leads or lags with respect to a first reference edge of the reference clock $CK_{REF2}$ (e.g. a delayed-by-(2×T) edge of the first edge of the reference clock $CK_{REF}$) for generating a third bit of the multiple bits of the first period code such as an output D2 of the BBPD PD2 at the first time point. The reset may be deduced by analogy, where the BBPD PDK is configured to detect whether the first edge of the divided clock $CK_{DTC}$ leads or lags with respect to a first reference edge of the reference clock $CK_{REFK}$ (e.g. a delayed-by-(K×T) edge of the first edge of the reference clock $CK_{REF}$) for generating a (K+1)$^{th}$ bit of the multiple bits of the first period code such as an output DK of the BBPD PDK at the first time point.

When generating the second period code, the BBPD PD0 is configured to detect whether the second edge of the divided clock $CK_{DTC}$ leads or lags with respect to a second reference edge of the reference clock $CK_{REF}$ (e.g. the second edge of the reference clock $CK_{REF}$ mentioned above) for generating a first bit of multiple bits of the second period code such as the output D0 of the BBPD PD0 at the second time point (e.g. at which the sub-clock period PD 120 performs the time-to-digital conversion upon the second period). The BBPD PD1 is configured to detect whether the second edge of the divided clock $CK_{DTC}$ leads or lags with respect to a second reference edge of the reference clock $CK_{REF1}$ (e.g. a delayed-by-T edge of the second edge of the reference clock $CK_{REF}$) for generating a second bit of the multiple bits of the second period code such as the output D1 of the BBPD PD1 at the second time point. The BBPD PD2 is configured to detect whether the second edge of the divided clock $CK_{DTC}$ leads or lags with respect to a second reference edge of the reference clock $CK_{REF2}$ (e.g. a delayed-by-(2×T) edge of the second edge of the reference clock $CK_{REF}$) for generating a third bit of the multiple bits of the second period code such as the output D2 of the BBPD PD2 at the second time point. The reset may be deduced by analogy, where the BBPD PDK is configured to detect whether the second edge of the divided clock $CK_{DTC}$ leads or lags with respect to a second reference edge of the reference clock $CK_{REFK}$ (e.g. a delayed-by-(K×T) edge of the second edge of the reference clock $CK_{REF}$) for generating a (K+1)$^{th}$ bit of the multiple bits of the second period code such as the output DK of the BBPD PDK at the second time point.

Figure 4:
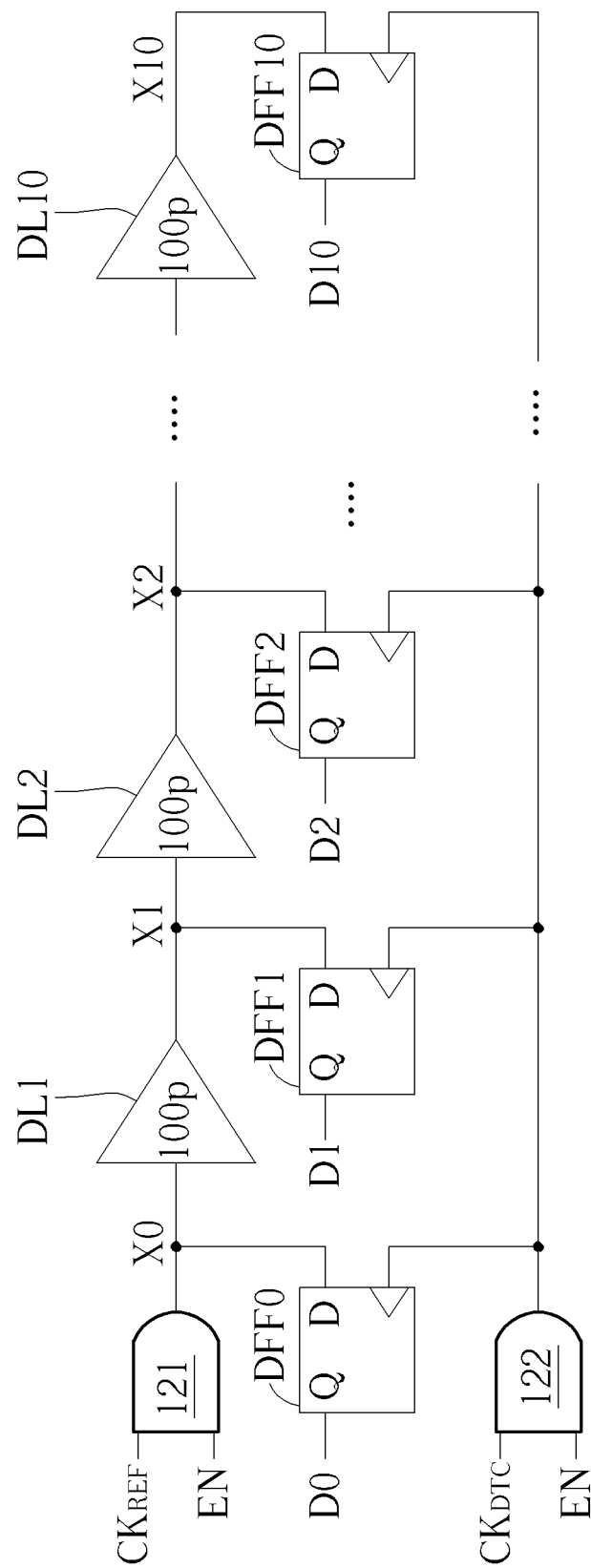
FIG. 4 is a diagram illustrating an example of a sub-clock period phase detector according to an embodiment of the present invention.

FIG. 4 is a diagram illustrating an example of the sub-clock period phase detector 120 shown in FIG. 3 according to an embodiment of the present invention, where FIG. 4 takes an 11-bit architecture as an example (i.e. K=10). The multiple delay elements may comprise delay elements DL1, DL2, ... and DL10, where each of the delay elements DL1, DL2, ... and DL10 are configured to apply a delay of 100 picoseconds (ps), that is, T=100 ps. In this embodiment, D-type flip-flops (DFFs) DFF0, DFF1, DFF2, ... and DFF10 may be examples of the multiple phase detectors mentioned above. In this embodiment, the sub-clock period phase detector 120 may further comprise AND gates 121 and 122 configured for controlling enablement of the time-to-digital conversion. For example, when an enablement control signal EN is "0", the time-to-digital conversion may be disabled. When the enablement control signal EN is "1", the reference clock $CK_{REF}$ may be output from the AND gate 121, and the divided clock $CK_DIV$ may be output from the AND gate 122. The enablement control signal EN may be set according to the gating window for controlling time points of performing the time-to-digital conversion upon the first period and the second period, but the present invention is not limited thereto.

In this embodiment, the delay elements DL1, DL2, ... and DL10 are connected in series. A signal X0 may represent the reference clock $CK_{REF}$ without being delayed by any of the delay elements DL1, DL2, ... and DL10, a signal X1 may represent a delayed-by-(100 ps) signal of the reference clock $CK_{REF}$ (e.g. delayed by the delay element DL1), a signal X2 may represent a delayed-by-(200 ps) signal of the reference clock $CK_{REF}$ (e.g. delayed by the delay elements DL1 and DL2), and the reset may be deduced by analogy, where a signal X10 may represent a delayed-by-(1000 ps) signal of the reference clock $CK_{REF}$ (e.g. delayed by the delay elements DL1, DL2, ... and DL10). The DFF DFF0 may utilize a data input terminal (which is labeled "D" on the DFF DFF0 shown in FIG. 4) to receive the signal X0, utilize a clock input terminal (which is illustrated by a triangle on the DFF DFF0 shown in FIG. 4) to receive the divided clock $CK_{DTC}$ from the AND gate 122, and utilize a data output terminal (which is labeled "Q" on the DFF DFF0 shown in FIG. 4) to generate the output D0. The DFF DFF1 may utilize a data input terminal (which is labeled "D" on the DFF DFF1 shown in FIG. 4) to receive the signal X1, utilize a clock input terminal (which is illustrated by a triangle on the DFF DFF1 shown in FIG. 4) to receive the divided clock $CK_{DTC}$ from the AND gate 122, and utilize a data output terminal (which is labeled "Q" on the DFF DFF1 shown in FIG. 4) to generate the output D1. The DFF DFF2 may utilize a data input terminal (which is labeled "D" on the DFF DFF2 shown in FIG. 4) to receive the signal X2, utilize a clock input terminal (which is illustrated by a triangle on the DFF DFF2 shown in FIG. 4) to receive the divided clock $CK_{DTC}$ from the AND gate 122, and utilize a data output terminal (which is labeled "Q" on the DFF DFF2 shown in FIG. 4) to generate the output D2. The rest may be deduced by analogy, where the DFF DFF10 may utilize a data input terminal (which is labeled "D" on the DFF DFF10 shown in FIG. 4) to receive the signal X10, utilize a clock input terminal (which is illustrated by a triangle on the DFF DFF10 shown in FIG. 4) to receive the divided clock $CK_{DTC}$ from the AND gate 122, and utilize a data output terminal (which is labeled "Q" on the DFF DFF10 shown in FIG. 4) to generate the output D10.

Figure 5:
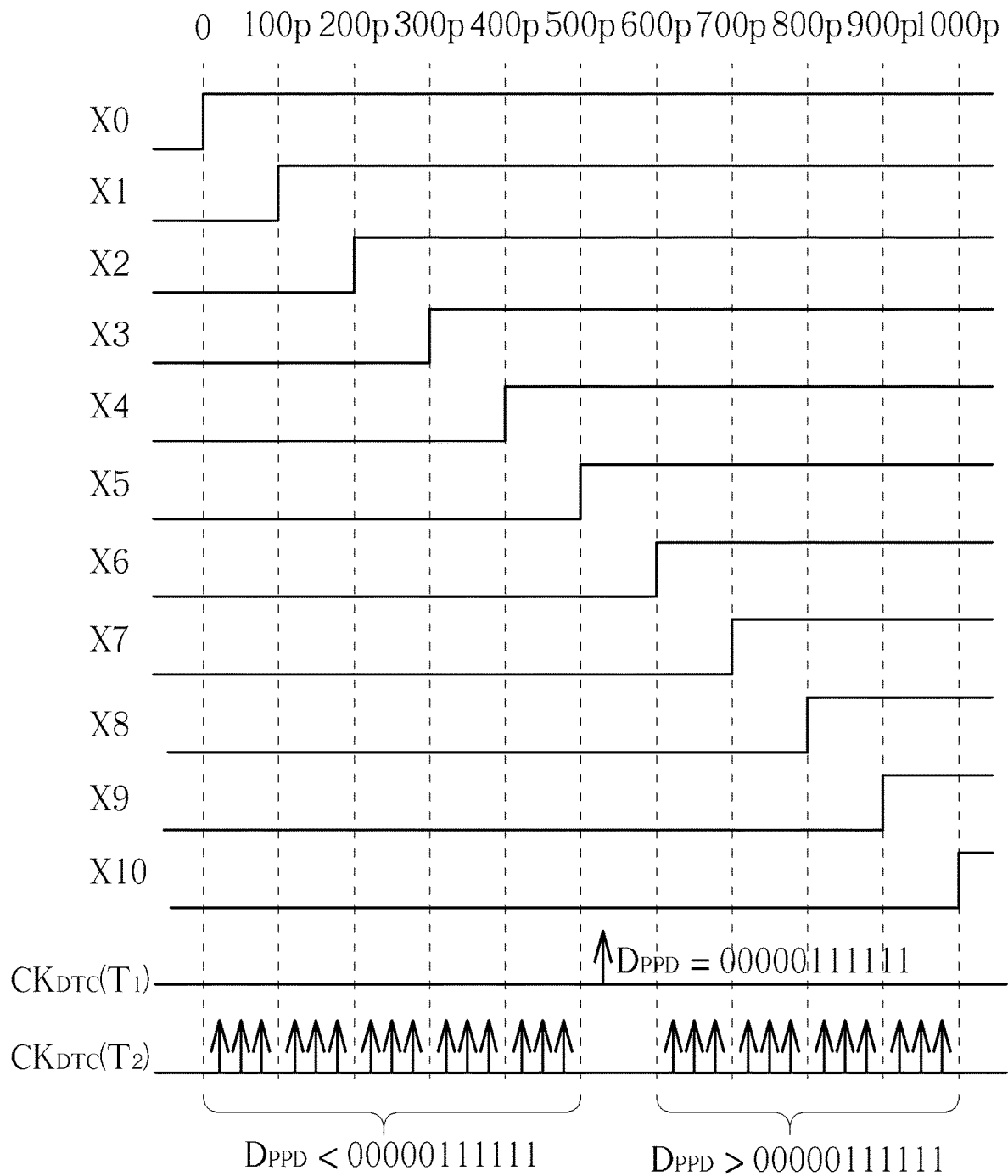
FIG. 5 is a diagram illustrating operations of the sub-clock period phase detector shown in FIG. 4 according to an embodiment of the present invention.

FIG. 5 is a diagram illustrating operations of the sub-clock period phase detector 120 shown in FIG. 4 according to an embodiment of the present invention. As shown in FIG. 5, the signals X1, X2, ... and X0 may have delayed edges of 100 ps, 200 ps, ... and 1000 ps (labeled "100p", "200p", ... and "1000p" in FIG. 5 for brevity) relative to a reference edge (e.g. the first reference edge or the second reference edge mentioned above) of the reference clock $CK_{REF}$ (such as the signal X0), respectively. In this embodiment, the period code $D_{PPD}$ may be expresses as a 11-bit signal such as {D10, D9, D8, D7, D6, D5, D4, D3, D2, D1, D0}. Regarding the time-to-digital conversion of the first period such as $T_1$, the output D0 may indicate whether the first period $T_1$ is greater than 0, the output D1 may indicate whether the first period $T_1$ is greater than 100 ps, the output D2 may indicate whether the first period $T_1$ is greater than 200 ps, and the rest may be deduced by analogy, where the output D9 may indicate whether the first period $T_1$ is greater than 900 ps, and the output D10 may indicate whether the first period $T_1$ is greater than 1000 ps. Regarding the time-to-digital conversion of the second period such as $T_2$, the output D0 may indicate whether the second period $T_2$ is greater than 0, the output D1 may indicate whether the second period $T_2$ is greater than 100 ps, the output D2 may indicate whether the second period $T_2$ is greater than 200 ps, and the rest may be deduced by analogy, where the output D9 may indicate whether the second period $T_2$ is greater than 900 ps, and the output D10 may indicate whether the second period $T_2$ is greater than 1000 ps.

In the embodiment of FIG. 5, an arrow on a row labeled "$CK_{DTC}(T_1)$" may illustrate an example of the first edge of the divided clock $CK_{DIV}$, and arrows on a row labeled "$CK_{DTC}(T_2)$" may illustrate examples of the second edge of the divided clock CKDIV Different results of the second period $T_2$ are shown in FIG. 5 together for better comprehension, and these results does not occurs at a same time in practice. Assume that the first period $T_1$ falls in an interval from 500 ps to 600 ps as show in FIG. 5, and the first period code such as the period code $D_{PPD}$ at the first time point may be {00000111111}. If the oscillation frequency of the VCO clock $CK_{VCO}$ is greater than the target and makes the second period $T_2$ be less than 500 ps (which means the VCO clock $CK_{VCO}$ is too fast), the second period code such as the period code $D_{PPD}$ at the second time point may be less than {00000111111} (labeled "DPPD<00000111111" in FIG. 5 for better comprehension). If the oscillation frequency of the VCO clock $CK_{VCO}$ is less than the target and makes the second period $T_2$ be greater than 600 ps (which means the VCO clock $CK_{VCO}$ is too slow), the second period code such as the period code DPPD at the second time point may be greater than {00000111111} (labeled "DPPD>00000111111" in FIG. 5 for better comprehension). Thus, the fast FCAL digital FSM 130 may compare the period code $D_{PPD}$ output at the second time point (which corresponds to the second period $T_2$) with the period code $D_{PPD}$ output at the first time point (which corresponds to the first period $T_1$) for determining whether the VCO clock $CK_{VCO}$ is too fast or too slow, and accordingly control (e.g. switch) the calibration code Tcode, in order to make the second period $T_2$ approach the first period $T_2$ (i.e. making the oscillation frequency of the VCO clock $CK_{VCO}$ approach the target).

Figure 6:
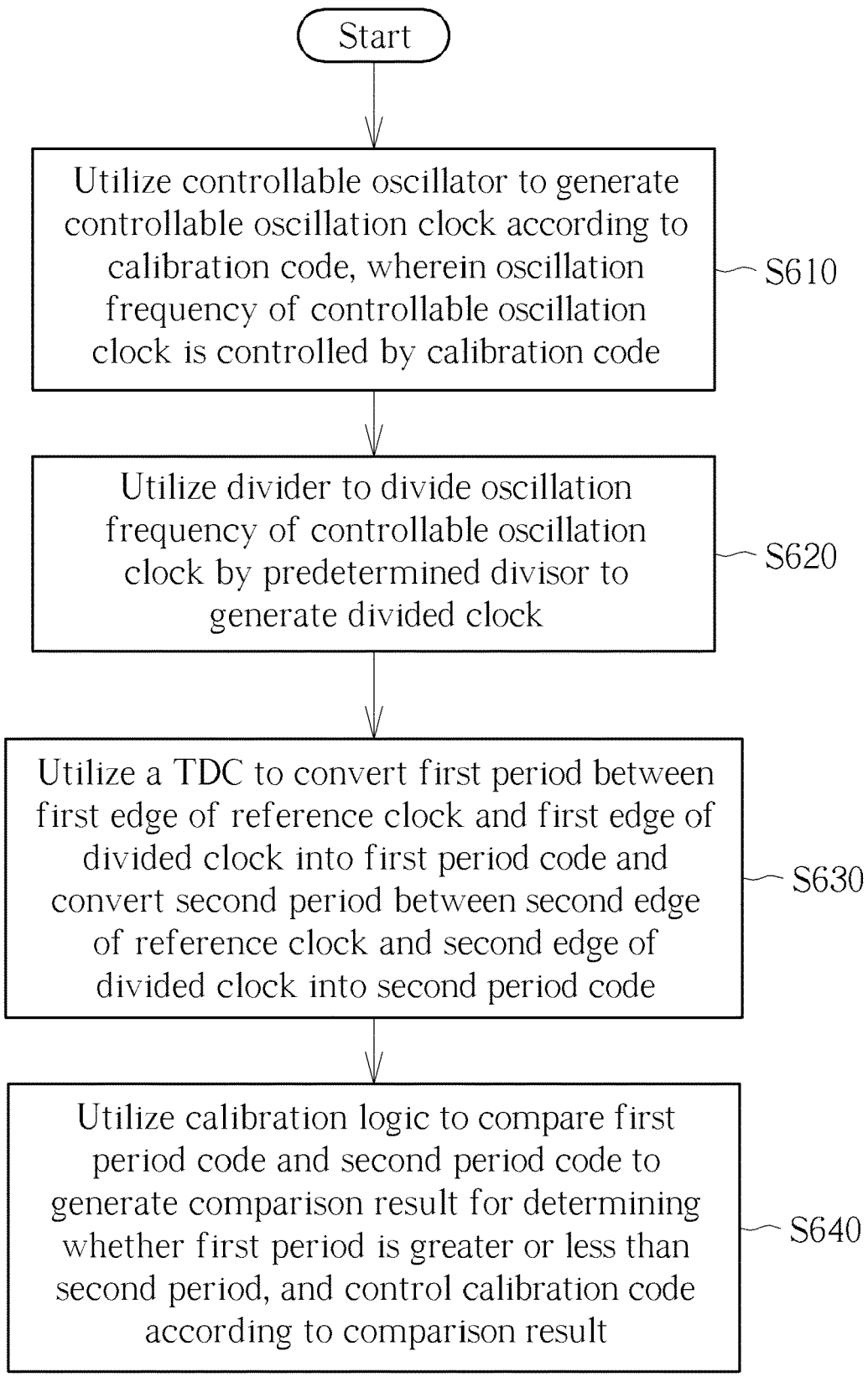
FIG. 6 is a diagram illustrating a working flow of a method for calibrating an oscillation frequency of a controllable oscillator according to an embodiment of the present invention.

FIG. 6 is a diagram illustrating a working flow of a method for calibrating an oscillation frequency of a controllable oscillator according to an embodiment of the present invention, where the method is applicable to a FCAL circuit such as the FCAL circuit 10 shown in FIG. 1, and the VCO 100 may be an example of the controllable oscillator. It should be note that the working flow shown in FIG. 6 is for illustrative purposes only, and is not meant to be a limitation of the present invention. For example, one or more steps may be added, deleted or modified in the working flow shown in FIG. 6. In addition, if an overall result is not changed, these steps do not have to be executed in the exact order shown in FIG. 6.

In Step S610, the FCAL circuit may utilize the controllable oscillator (e.g. the VCO 100 shown in FIG. 1) to generate a controllable oscillation clock according to a calibration code, wherein the oscillation frequency of the controllable oscillation clock is controlled according to the calibration code.

In Step S620, the FCAL circuit may utilize a divider (e.g. the fractional-N divider 110 shown in FIG. 1) to divide the oscillation frequency of the controllable oscillation clock by a predetermined divisor to generate a divided clock.

In Step S630, the FCAL circuit may utilize a TDC (e.g. the sub-clock period PD 120 shown in FIG. 1) to convert a first period between a first edge of a reference clock and a first edge of the divided clock into a first period code and convert a second period between a second edge of the reference clock and a second edge of the divided clock into a second period code.

In Step S640, the FCAL circuit may utilize a calibration logic (e.g. the fast FCAL digital FSM 130 shown in FIG. 1) to compare the first period code and the second period code to generate a comparison result for determining whether the first period is greater or less than the second period, and control the calibration code according to the comparison result.

It should be noted that even though the present invention performs the time-to-digital conversion upon the first period and the second period for generating the first period code and the second period code, the present invention merely needs to determine whether the second period code is greater than the first period code (e.g. whether the second period is greater than the first period) for determining whether the VCO clock $CK_{VCO}$ is too fast or too slow, where absolute precision of the time-to-digital conversion does not affect the comparison of the first period and the second period. Thus, performance of the circuit for performing the time-to-digital conversion is not strict and is easy to be implemented (e.g. calibration of the time-to-digital conversion is not required). In addition, comparing the first period and the second period can be regarded as utilizing the information of the fractional portion of the number of cycles of the VCO clock $CK_{VCO}$ within the gating window, which greatly improve the resolution of determining whether the VCO clock $CK_{VCO}$ is too fast or too slow in comparison with utilizing the integer portion of the number of cycles of the VCO clock $CK_{VCO}$ only. More particularly, the resolution of determining whether the VCO clock $CK_{VCO}$ is too fast or too slow may be improved by reducing the unit delay T mentioned above without increasing the width of the gating window. Thus, the resolution of the FCAL can be greatly improved without increasing an overall time for completing the FCAL. In some embodiment, the overall time for making the oscillation frequency achieve target accuracy may be greatly reduced.

To summarize, the FCAL circuit and the method provided by the embodiments of the present invention can compare the first period and the second period for determining whether the oscillation frequency is greater or less than the target, which greatly improve an overall efficiency (e.g. speed and resolution) of the FCAL. In addition, the embodiments of the present invention will not greatly increase additional costs. Thus, the present invention can improve an overall efficiency of the FCAL without introducing any side effect or in a way that is less likely to introduce side effects.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A frequency calibration (FCAL) circuit, comprising:
   a controllable oscillator, configured to generate a controllable oscillation clock according to a calibration code, wherein an oscillation frequency of the controllable oscillation clock is controlled according to the calibration code;
   a divider, coupled to the controllable oscillator, configured to divide the oscillation frequency of the controllable oscillation clock by a predetermined divisor to generate a divided clock;
   a time-to-digital converter (TDC), coupled to the divider, configured to convert a first period between a first edge of a reference clock and a first edge of the divided clock into a first period code and convert a second period between a second edge of the reference clock and a second edge of the divided clock into a second period code; and
   a calibration logic, coupled to the controllable oscillator and the TDC, configured to compare the first period code and the second period code to generate a comparison result for determining whether the first period is greater or less than the second period, and control the calibration code according to the comparison result.

2. The FCAL circuit of claim 1, wherein the calibration logic is configured to control the calibration code to make the second period code approach the first period code.

3. The FCAL circuit of claim 1, wherein when the comparison result indicates that the second period is less than the first period, the calibration logic switches the calibration code to reduce the oscillation frequency of the controllable oscillation clock; and when the comparison result indicates that the second period is greater than the first period, the calibration logic switches the calibration code to increase the oscillation frequency of the controllable oscillation clock.

4. The FCAL circuit of claim 1, wherein the first edge of the divided clock and the second edge of the divided clock are edges respectively following the first edge of the reference clock and the second edge of the reference clock.

5. The FCAL circuit of claim 1, wherein the predetermined divisor is set according to a ratio of a target of the oscillation frequency of the controllable oscillation clock and a reference frequency of the reference clock.

6. The FCAL circuit of claim 1, wherein the divider is a divided-by-N divider, and N represents the predetermined divisor which is a non-integer divisor.

7. The FCAL circuit of claim 6, wherein the divided-by-N divider comprises:
   a divided-by-M divider, coupled to the controllable oscillator, configured to divide the oscillation frequency of the controllable oscillation clock by an integer divisor to generate a divided-by-integer clock, wherein M represents the integer divisor; and
   a controllable delay circuit, coupled to the divided-by-M divider, configured to apply a controllable delay to the divided-by-integer clock for generating the divided clock;
   wherein the integer divisor is controlled according to an integer portion of the predetermined divisor, and the controllable delay is controlled according to a fractional portion of the predetermined divisor.

8. The FCAL circuit of claim 7, wherein the divided-by-N divider further comprises:
a sigma-delta modulator, coupled to the divided-by-M divider and the controllable delay circuit, configured to generate an integer control signal according to the integer portion of the predetermined divisor for controlling the integer divisor and generate a fractional control signal according to the fractional portion of the predetermined divisor for controlling the controllable delay.

9. The FCAL circuit of claim 1, wherein the TDC comprises:
multiple delay elements, configured to generate multiple delayed reference clocks by applying different delays to the reference clock; and
multiple phase detectors, respectively coupled to the multiple delay element, wherein any of the multiple phase detector is configured to detect whether the first edge of the divided clock leads or lags with respect to a first reference edge of a corresponding one of the multiple delayed reference clocks for generating one of multiple bits of the first period code, and detect whether the second edge of the divided clock leads or lags with respect to a second reference edge of the corresponding one of the multiple delayed reference clocks for generating one of multiple bits of the second period code.

10. A method for calibrating an oscillation frequency of a controllable oscillator, comprising:
utilizing the controllable oscillator to generate a controllable oscillation clock according to a calibration code, wherein the oscillation frequency of the controllable oscillation clock is controlled according to the calibration code;
utilizing a divider to divide the oscillation frequency of the controllable oscillation clock by a predetermined divisor to generate a divided clock;
utilizing a time-to-digital converter (TDC) to convert a first period between a first edge of a reference clock and a first edge of the divided clock into a first period code and convert a second period between a second edge of the reference clock and a second edge of the divided clock into a second period code; and
utilizing a calibration logic to compare the first period code and the second period code to generate a comparison result for determining whether the first period is greater or less than the second period, and control the calibration code according to the comparison result.

11. The method of claim 10, wherein utilizing the calibration logic to compare the first period code and the second period code to generate the comparison result for determining whether the first period is greater or less than the second period and control the calibration code according to the comparison result comprises:
utilizing the calibration logic to control the calibration code to make the second period code approach the first period code.

12. The method of claim 10, wherein utilizing the calibration logic to compare the first period code and the second period code to generate the comparison result for determining whether the first period is greater or less than the second period and control the calibration code according to the comparison result comprises:
in response to the comparison result indicating that the second period is less than the first period, utilizing the calibration logic to switch the calibration code to reduce the oscillation frequency of the controllable oscillation clock.

13. The method of claim 10, wherein utilizing the calibration logic to compare the first period code and the second period code to generate the comparison result for determining whether the first period is greater or less than the second period and control the calibration code according to the comparison result comprises:
in response to the comparison result indicating that the second period is greater than the first period, the calibration logic switches the calibration code to increase the oscillation frequency of the controllable oscillation clock.

14. The method of claim 10, wherein the first edge of the divided clock and the second edge of the divided clock are edges respectively following the first edge of the reference clock and the second edge of the reference clock.

15. The method of claim 10, wherein the predetermined divisor is set according to a ratio of a target of the oscillation frequency of the controllable oscillation clock and a reference frequency of the reference clock.

16. The method of claim 10, wherein the divider is a divided-by-N divider, and N represents the predetermined divisor which is a non-integer divisor.

17. The method of claim 16, wherein utilizing the divider to divide the oscillation frequency of the controllable oscillation clock by the predetermined divisor to generate the divided clock comprises:
utilizing a divided-by-M divider to divide the oscillation frequency of the controllable oscillation clock by an integer divisor to generate a divided-by-integer clock, wherein M represents the integer divisor; and
utilizing a controllable delay circuit to apply a controllable delay to the divided-by-integer clock for generating the divided clock;
wherein the integer divisor is controlled according to an integer portion of the predetermined divisor, and the controllable delay is controlled according to a fractional portion of the predetermined divisor.

18. The method of claim 17, wherein utilizing the divider to divide the oscillation frequency of the controllable oscillation clock by the predetermined divisor to generate the divided clock further comprises:
utilizing a sigma-delta modulator to generate an integer control signal according to the integer portion of the predetermined divisor for controlling the integer divisor and generate a fractional control signal according to the fractional portion of the predetermined divisor for controlling the controllable delay.

19. The method of claim 10, wherein utilizing the TDC to convert the first period between the first edge of the reference clock and the first edge of the divided clock into the first period code and convert the second period between the second edge of the reference clock and the second edge of the divided clock into the second period code comprises:
utilizing multiple delay elements to generate multiple delayed reference clocks by applying different delays to the reference clock, wherein multiple phase detectors are respectively coupled to the multiple delay element; and
utilizing any of the multiple phase detector to detect whether the first edge of the divided clock leads or lags with respect to a first reference edge of a corresponding one of the multiple delayed reference clocks for generating one of multiple bits of the first period code, and detect whether the second edge of the divided clock leads or lags with respect to a second reference edge of the corresponding one of the multiple delayed reference clocks for generating one of multiple bits of the second period code.

* * * * *